(12) United States Patent
Furuno et al.

(10) Patent No.: US 8,846,530 B2
(45) Date of Patent: Sep. 30, 2014

(54) METHOD FOR FORMING SEMICONDUCTOR REGION AND METHOD FOR MANUFACTURING POWER STORAGE DEVICE

(75) Inventors: Makoto Furuno, Kanagawa (JP); Takashi Shimazu, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 406 days.

(21) Appl. No.: 13/158,629

(22) Filed: Jun. 13, 2011

(65) Prior Publication Data
US 2012/0003807 A1 Jan. 5, 2012

(30) Foreign Application Priority Data

Jun. 30, 2010 (JP) ................................ 2010-150098

(51) Int. Cl.
| | |
|---|---|
| H01L 21/44 | (2006.01) |
| H01L 21/20 | (2006.01) |
| H01L 21/36 | (2006.01) |
| H01M 4/66 | (2006.01) |
| H01L 21/02 | (2006.01) |
| H01M 4/13 | (2010.01) |

(52) U.S. Cl.
CPC ......... *H01L 21/02532* (2013.01); *H01M 4/664* (2013.01); *Y02E 60/122* (2013.01); *H01L 21/0262* (2013.01); *H01L 21/02603* (2013.01); *H01M 4/667* (2013.01); *H01M 4/661* (2013.01); *H01M 4/13* (2013.01); *Y10S 977/72* (2013.01); *Y10S 977/811* (2013.01)
USPC .... 438/680; 438/381; 438/486; 257/E21.003; 257/E21.09; 257/E21.17; 977/720; 977/811

(58) Field of Classification Search
USPC ......... 438/113, 381, 486, 488, 489, 492, 493, 438/597, 602–607, 644, 660, 665, 680, 438/681; 257/E21.003, E21.09, E21.17
See application file for complete search history.

(56) References Cited

U.S. PATENT DOCUMENTS

| | | | |
|---|---|---|---|
| 3,796,598 | A | 3/1974 | Gejyo et al. |
| 4,155,781 | A | 5/1979 | Diepers |

(Continued)

FOREIGN PATENT DOCUMENTS

| | | |
|---|---|---|
| JP | 2001-210315 | 8/2001 |
| JP | 2002-083594 | 3/2002 |

(Continued)

OTHER PUBLICATIONS

Li-Feng Cui et al., "Crystalline-Amorphous Core-Shell Silicon Nanowires for High Capacity and High Current Battery Electrodes", Nano Lett, (Nano Letters), 2009, vol. 9, No. 1, pp. 491-495.

(Continued)

*Primary Examiner* — Calvin Choi
(74) *Attorney, Agent, or Firm* — Nixon Peabody LLP; Jeffrey L. Costellia

(57) ABSTRACT

To provide a method for manufacturing a power storage device which enables improvement in performance of the power storage device, such as an increase in discharge capacity. To provide a method for forming a semiconductor region which is used for a power storage device or the like so as to improve performance. A method for forming a crystalline semiconductor region includes the steps of: forming, over a conductive layer, a crystalline semiconductor region that includes a plurality of whiskers including a crystalline semiconductor by an LPCVD method; and performing heat treatment on the crystalline semiconductor region after supply of a source gas containing a deposition gas including silicon is stopped. A method for manufacturing a power storage device includes the step of using the crystalline semiconductor region as an active material layer of the power storage device.

16 Claims, 8 Drawing Sheets

(56) References Cited

U.S. PATENT DOCUMENTS

| | | |
|---|---|---|
| 5,338,625 A | 8/1994 | Bates et al. |
| 6,451,113 B1 | 9/2002 | Givargizov |
| 6,685,804 B1 | 2/2004 | Ikeda et al. |
| 6,844,113 B2 | 1/2005 | Yagi et al. |
| 6,887,511 B1 | 5/2005 | Shima et al. |
| 7,015,496 B2 | 3/2006 | Ohnuma et al. |
| 7,192,673 B1 | 3/2007 | Ikeda et al. |
| 7,235,330 B1 | 6/2007 | Fujimoto et al. |
| 7,241,533 B1 | 7/2007 | Ikeda et al. |
| 7,396,409 B2 | 7/2008 | Hatta et al. |
| 7,410,728 B1 | 8/2008 | Fujimoto et al. |
| 7,794,881 B1 | 9/2010 | Fujimoto et al. |
| 2007/0007239 A1 | 1/2007 | Lee et al. |
| 2007/0292339 A1* | 12/2007 | Kubomura et al. ........... 423/608 |
| 2009/0050204 A1* | 2/2009 | Habib ........................ 136/261 |
| 2009/0117462 A1 | 5/2009 | Okazaki et al. |
| 2009/0136847 A1 | 5/2009 | Jeong et al. |
| 2009/0317726 A1 | 12/2009 | Hirose et al. |
| 2010/0209784 A1 | 8/2010 | Yamazaki et al. |
| 2011/0151290 A1 | 6/2011 | Cui et al. |
| 2011/0266654 A1 | 11/2011 | Kuriki et al. |
| 2011/0294005 A1 | 12/2011 | Kuriki et al. |
| 2011/0294011 A1 | 12/2011 | Kuriki et al. |
| 2011/0300445 A1 | 12/2011 | Murakami et al. |
| 2012/0003383 A1 | 1/2012 | Furuno |
| 2012/0328962 A1 | 12/2012 | Takeuchi et al. |

FOREIGN PATENT DOCUMENTS

| | | |
|---|---|---|
| JP | 2003-246700 | 9/2003 |
| JP | 2004-281317 | 10/2004 |
| JP | 2010-262752 A | 11/2010 |

OTHER PUBLICATIONS

T. I. Kamins et al., "Ti-catalyzed Si nanowires by chemical vapor deposition: Microscopy and growth mechanisms", J. Appl. Phys. (Journal of Applied Physics), Jan. 15, 2001, vol. 89, No. 2, pp. 1008-1016.

Hideo Kohno et al., "Silicon Nanoneedles Grown by a Simple Thermal Treatment Using Metal-Sulfur Catalysts". Jpn. J. Appl. Phys. (Japanese Journal of Applied Physics), Feb. 2002, vol. 41, Part 1, No. 2A, pp. 577-578.

H. Jung et al., "Amorphous silicon thin-film negative electrode prepared by low pressure chemical vapor deposition for lithium-ion batteries", *Solid State Commun.*, 2003, vol. 125, No. 7-8, pp. 387-390.

C. K. Chan et al., "High-performance lithium battery anodes using silicon nanowires", *Nat. Nanotech.*, 2008, vol. 3, Issue 1, pp. 31-35.

\* cited by examiner

METHOD FOR FORMING SEMICONDUCTOR REGION AND METHOD FOR MANUFACTURING POWER STORAGE DEVICE

BACKGROUND OF THE INVENTION

1. Field of the Invention

The present invention relates to a method for forming a semiconductor region and a method for manufacturing a power storage device.

Note that the power storage device indicates all elements and devices which have a function of storing power.

2. Description of the Related Art

In recent years, power storage devices such as lithium-ion secondary batteries, lithium-ion capacitors, and air cells have been developed.

An electrode for the power storage device is manufactured by providing an active material on a surface of a current collector. As the active material, a material which can store and release ions functioning as carriers, such as carbon or silicon, is used. For example, silicon or phosphorus-doped silicon has an advantage of larger theoretical capacity than carbon and larger capacity of a power storage device (e.g., Patent Document 1).

REFERENCE

[Patent Document 1] Japanese Published Patent Application No. 2001-210315

SUMMARY OF THE INVENTION

However, even when silicon is used as a negative electrode active material, it is difficult to obtain a discharge capacity as high as the theoretical capacity. Thus, it is an object to provide a method for manufacturing a power storage device which enables improvement in performance of the power storage device, such as an increase in discharge capacity. In addition, it is another object to provide a method for forming a semiconductor region which is used for a power storage device or the like so as to be able to improve performance.

One embodiment of the present invention is a method for forming, over a conductive layer, a crystalline semiconductor region which includes a plurality of whiskers including a crystalline semiconductor by a low pressure chemical vapor-phase deposition method (hereinafter also referred to as a low pressure CVD method or a low pressure chemical vapor deposition (LPCVD) method, and performing heat treatment on the crystalline semiconductor region after supply of a source gas containing a deposition gas including silicon is stopped. One embodiment of the present invention is a method for manufacturing a power storage device in which the crystalline semiconductor region is used for an active material layer of the power storage device.

One embodiment of the present invention is a method for forming, over a conductive layer, a crystalline semiconductor region which includes a plurality of whiskers including a crystalline semiconductor by an LPCVD method, forming a mixed layer in part of the conductive layer or the entire conductive layer, and performing heat treatment on the crystalline semiconductor region after supply of a source gas containing a deposition gas including silicon is stopped. One embodiment of the present invention is a method for manufacturing a power storage device in which the crystalline semiconductor region is used for an active material layer of the power storage device.

Note that an LPCVD method is performed in such a way that a source gas containing a deposition gas including silicon is supplied in a reaction space. Further, an LPCVD method is performed at a temperature higher than 550° C.

Alternatively, the heat treatment may be performed at a temperature higher than 550° C. In addition, silicon hydride, silicon fluoride, or silicon chloride may be used for the deposition gas including silicon.

The conductive layer can be formed using a metal element which forms silicide by reacting with silicon. Alternatively, the conductive layer can have a layered structure in which a layer formed using a high conductive material of a metal element or the like typified by platinum, aluminum, or copper and a layer formed using a metal element which forms silicide by reacting with silicon.

According to one embodiment of the present invention, it is possible to form a power storage device or the like with improved performances in discharge capacity or charge capacity. In addition, a semiconductor region which is used in a power storage device or the like so as to be able to improve performance can be formed.

DETAILED DESCRIPTION OF THE INVENTION

Figure 1A:
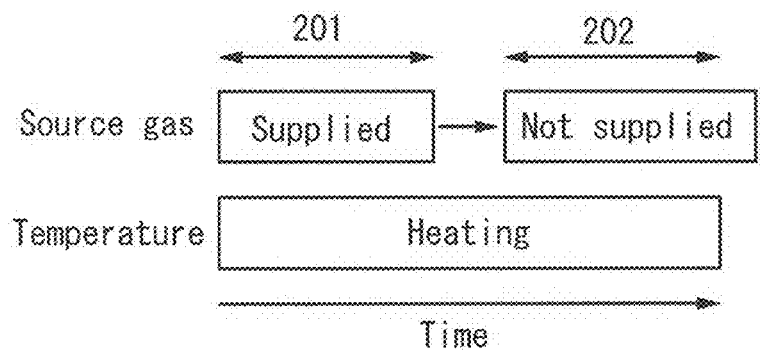
FIGS. 1A and 1B illustrate a method for forming a semiconductor region.

Embodiments and examples of the present invention will be described hereinafter with reference to the drawings. Note that the present invention is not limited to the following description, and it will be easily understood by those skilled in the art that various changes and modifications can be made without departing from the spirit and scope of the invention. Thus, the present invention should not be interpreted as being limited to the following description of the embodiments. In description with reference to the drawings, in some cases, the same reference numerals are used in common for the same portions in different drawings. Further, in some cases, the same hatching patterns are applied to similar parts, and the similar parts are not necessarily designated by reference numerals.

(Embodiment 1)

In this embodiment, a method for forming a semiconductor region which is one embodiment of the present invention and a method for manufacturing a power storage device which is one embodiment of the present invention will be described.

The method for forming a semiconductor region will be described with reference to FIGS. 1A and 1B and FIGS. 2A and 2B.

Figure 2A:
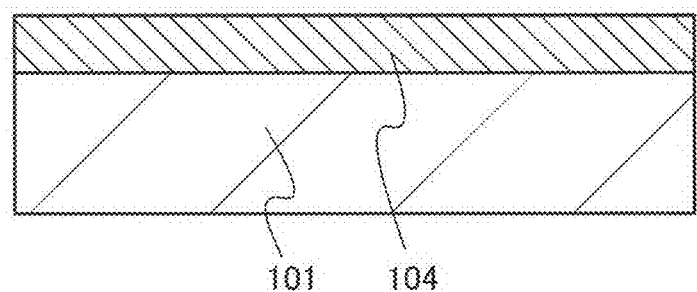
FIGS. 2A and 2B are cross-sectional views illustrating a method for forming a semiconductor region.

As illustrated in FIG. 2A, a conductive layer 104 is formed over a substrate 101. The conductive layer 104 can be formed by a printing method, a sol-gel method, a coating method, an ink-jet method, a CVD method, a sputtering method, an evaporation method, or the like, as appropriate. In addition, the conductive layer 104 may have a foil shape, a plate shape, a net shape, or the like. Note that in the case where the conductive layer 104 has a foil shape, the substrate 101 is not necessarily provided. Alternatively, a Roll-to-Roll process can be used.

The conductive layer 104 is formed using a metal element which forms silicide by reacting with silicon. Alternatively, the conductive layer 104 may have a layered structure which includes a layer formed using a metal element with high conductivity typified by platinum; aluminum; copper; titanium; an aluminum alloy to which an element that improves heat-resistance property, such as silicon, titanium, neodymium, scandium, or molybdenum is added; or the like on the substrate 101 side and a layer formed using a metal element which forms silicide by reacting with silicon on a crystalline semiconductor region 109 side. Examples of the metal element which forms silicide by reacting with silicon include zirconium, titanium, hafnium, vanadium, niobium, tantalum, chromium, molybdenum, cobalt, nickel, and the like.

Figure 2B:
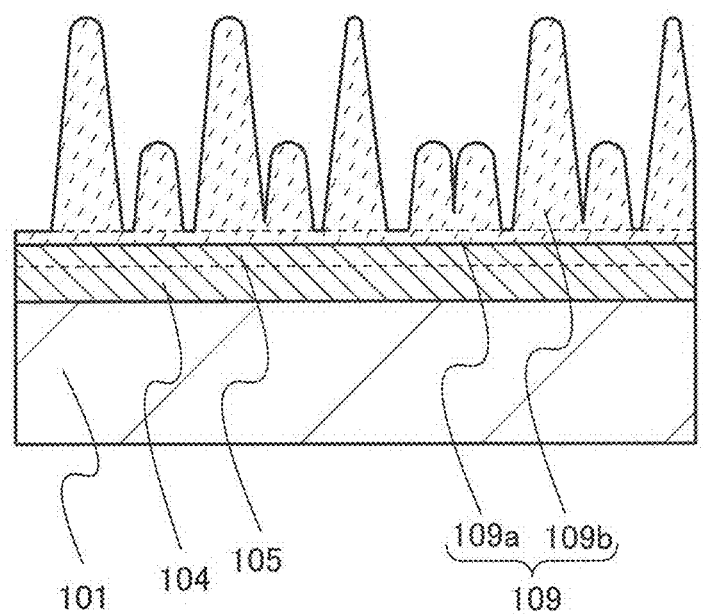

Next, as illustrated in FIG. 2B, a crystalline semiconductor region 109 which includes a crystalline semiconductor region 109a and a plurality of whiskers 109b including a crystalline semiconductor is formed over the conductive layer 104. A plurality of whiskers is also referred to as a whisker group.

Figure 1B:
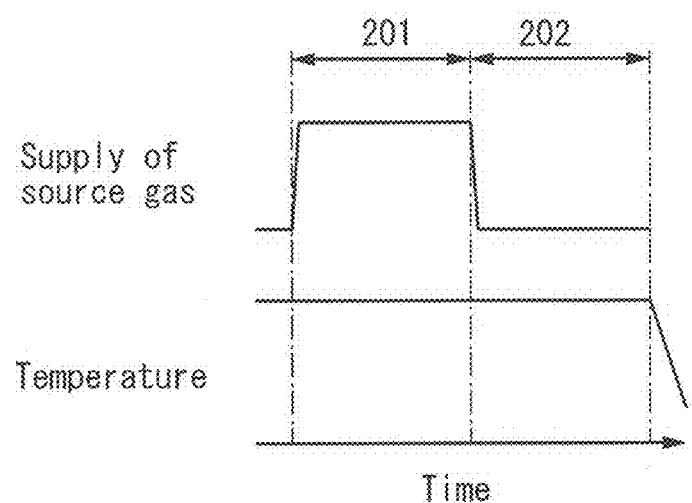

A method for forming the crystalline semiconductor region 109 is described with reference to FIGS. 1A and 1B. The formation of the crystalline semiconductor region 109 has a first step 201 and a second step 202 as illustrated in FIGS. 1A and 1B.

First, in the first step 201, a source gas containing a deposition gas including silicon is supplied to a reaction space, and the crystalline semiconductor region 109 which includes the crystalline semiconductor region 109a and the plurality of whiskers 109b including a crystalline semiconductor is formed over the conductive layer by a LPCVD method. The LPCVD method is performed at higher than 550° C. and lower than or equal to the temperature that an LPCVD apparatus and the conductive layer 104 can withstand, preferably higher than or equal to 580° C. and lower than 650° C. In other words, in the first step 201, heating is performed in a state in which the source gas is supplied.

Next, the second step 202 is described. In the second step 202, supply of the source gas is stopped, and heat treatment is performed. The heat treatment can be performed at higher than 550° C. and lower than or equal to the temperature that the LPCVD apparatus and the conductive layer 104 can withstand, preferably higher than or equal to 580° C. and lower than 700° C., which is almost the same as the temperature in the first step 201. In other words, in the second step 202, the heat treatment is performed in a state in which the supply of the source gas is stopped. The duration of the heat treatment is preferably greater than or equal to 1 hour and less than or equal to 5 hours. Note that the temperature in the first step 201 and the temperature in the second step 202 may be substantially the same or different from each other. In addition, the temperature in the second step 202 may be kept constant or may be changed step by step or continuously.

In this manner, through the first step 201 and the second step 202, the crystalline semiconductor region 109 which includes the crystalline semiconductor region 109a and the plurality of whiskers 109b including a crystalline semiconductor can be formed as illustrated in FIG. 2B. Through the first step 201 and the second step 202, the number of the whiskers 109b per unit area and density of the whiskers 109b can be increased. Further, growth of the whiskers 109b is promoted. The number of the whiskers 109b in the crystalline semiconductor region 109 formed through the above-described process can be greater than or equal to 5 per 100 μm², preferably greater than or equal to 10 per 100 μm².

Note that pressure of the LPCVD method in the first step 201 is set to higher than or equal to the lower limit pressure which can be held while a source gas flows (e.g., higher than or equal to 5 Pa) and lower than or equal to 200 Pa, preferably higher than or equal to 5 Pa and lower than or equal to 20 Pa. In addition, pressure in the second step 202 can be set to higher than or equal to the pressure at which the source gas can be discharged by an exhaust system (specifically, higher than or equal to $10^{-4}$ Pa, for example, higher than or equal to $10^{-2}$ Pa). In addition, the upper limit pressure in the second step 202 can be set to 200 Pa which is substantially the same as the upper limit pressure in the first step 201. Alternatively, the pressure in the second step 202 may be lower than the pressure in the first step 201, or the pressure in the second step 202 may be substantially the same as the pressure in the first step 201.

In the first step 201 or the second step 202, a rare gas such as helium, neon, argon, or xenon; or nitrogen may be mixed.

Examples of the deposition gas including silicon include silicon hydride, silicon fluoride, and silicon chloride; typically, $SiH_4$, $Si_2H_6$, $SiF_4$, $SiCl_4$, $Si_2Cl_6$, $SiH_2Cl_2$, and the like are given. Note that hydrogen may be introduced to the source gas.

When the crystalline semiconductor region 109 is formed, depending on heat conditions, a mixed layer 105 is formed between the conductive layer 104 and the crystalline semiconductor region 109 as illustrated in FIG. 2B. In a step of forming the crystalline semiconductor region 109, active species in the source gas are supplied to a deposition portion; therefore, silicon is diffused into the conductive layer 104 from the crystalline semiconductor region 109, so that the mixed layer 105 is formed. In the case where the mixed layer 105 is formed in part of the conductive layer 104, the mixed layer 105 and the conductive layer 104 are provided below the crystalline semiconductor region 109. In the case where the mixed layer 105 is formed in the entire conductive layer 104, the mixed layer 105 is provided below the crystalline semiconductor region 109. Note that the mixed layer 105 also functions as a conductive layer because the mixed layer 105 has conductivity.

When the conductive layer 104 is formed using a metal element which forms silicide by reacting with silicon, silicide of the metal element which forms silicide is formed in the mixed layer 105; typically, one or more of zirconium silicide, titanium silicide, hafnium silicide, vanadium silicide, niobium silicide, tantalum silicide, chromium silicide, molybdenum silicide, cobalt silicide, and nickel silicide, is/are formed. Alternatively, an alloy layer of silicon and a metal element which forms silicide is formed.

When the mixed layer 105 is formed, a silicon low-density region (rough region) is difficult to be formed at the interface between the mixed layer 105 and the crystalline semiconductor region 109, and characteristics of the interface between the mixed layer 105 and the crystalline semiconductor region 109 become good, whereby series resistance can be further reduced.

Note that, in some cases, a metal oxide layer (not illustrated) including an oxide of a metal element which forms the conductive layer 104 is formed over the conductive layer 104 or the mixed layer 105 when the mixed layer 105 is formed. This is because oxygen is desorbed from the quartz chamber of an LPCVD apparatus by the heating performed in the formation of the crystalline semiconductor region 109 by an LPCVD method, and the conductive layer 104 is oxidized. Note that when the crystalline semiconductor region 109 is formed by the LPCVD method, by filling the chamber with a rare gas such as helium, neon, argon, or xenon, the metal oxide layer is not formed. Note that in the case where the mixed layer 105 is formed, the metal oxide layer may be formed in advance on a surface of the conductive layer 104 before the mixed layer 105 is formed.

When the conductive layer 104 is formed using the metal element which forms silicide by reacting with silicon, a metal oxide layer containing an oxide of the metal element which forms silicide by reacting with silicon is formed as the metal oxide layer.

The metal oxide layer is formed using, typically, zirconium oxide, titanium oxide, hafnium oxide, vanadium oxide, niobium oxide, tantalum oxide, chromium oxide, molybdenum oxide, tungsten oxide, cobalt oxide, nickel oxide, or the like. Note that when the conductive layer 104 is formed using titanium, zirconium, niobium, tungsten, or the like, the metal oxide layer is formed using an oxide semiconductor such as titanium oxide, zirconium oxide, niobium oxide, or tungsten oxide; therefore, it is possible to reduce resistance between the conductive layer 104 or the mixed layer 105 and the crystalline semiconductor region 109.

Before the crystalline semiconductor region 109 is formed, the surface of the conductive layer 104 or the surface of the mixed layer 105 may be subjected to surface treatment with hydrofluoric acid, an ammonia hydrogen peroxide mixture, a hydrofluoric acid/hydrogen peroxide mixture, a hydrochloric acid/hydrogen peroxide mixture, or the like. By the above step, adhesion between the conductive layer 104 or the mixed layer 105 and the crystalline semiconductor region 109 can be increased.

Note that impurity elements imparting one conductivity type, such as phosphorus or boron, may be added to the crystalline semiconductor region 109. By the step, conductivity of the crystalline semiconductor region 109 can be increased.

Through the above steps, the crystalline semiconductor region 109 which includes the crystalline semiconductor region 109a and the plurality of whiskers 109b including a crystalline semiconductor can be formed over the conductive layer 104 or the mixed layer 105 as illustrated in FIG. 2B.

Note that an interface between the crystalline semiconductor region 109a and the whiskers 109b is not clear. Therefore, a plane that is in the same level as the bottom of the deepest valley of valleys formed among the plurality of whiskers 109b and is parallel to the surface of the conductive layer 104 or the surface of the mixed layer 105 is regarded as the interface between the crystalline semiconductor region 109a and the whiskers 109b.

The crystalline semiconductor region 109a covers the conductive layer 104 or the mixed layer 105. The whiskers 109b look like whiskers, and the whiskers 109b are dispersed. Note that each of the whiskers 109b may have a columnar shape such as a cylinder shape or a prism shape, or a needle shape such as a cone shape or a pyramid shape. The top of each of the whiskers 109b may be curved. The diameter of each of the whiskers 109b is greater than or equal to 100 nm and less than or equal to 10 µm, preferably greater than or equal to 500 nm and less than or equal to 3 µm. In addition, the length in an axis of each of the whiskers 109b is greater than or equal to 2.5 µM and less than or equal to 100 µm. Further, lengths in the axes of the plurality of whiskers may be different from each other.

Note that a whisker whose length in the axis of the whisker is greater than at least the diameter of the whisker is referred to as the whisker 109b.

Note that the length in the axis of each of the whiskers 109b means the distance between the top of each of the whiskers 109b (or the center of the top surface thereof) and the crystalline semiconductor region 109a in the axis running through the top of each of the whiskers 109b (or the center of the top surface thereof). In addition, the thickness of the crystalline semiconductor region 109 is the sum of the thickness of the crystalline semiconductor region 109a and the length of a normal from the top of each of the whiskers 109b to the crystalline semiconductor region 109a (that is, the height of each of the whiskers 109b). In addition, the diameter of each of the whiskers 109b means the length of the long axis of a sliced cross-sectional shape at the interface between the crystalline semiconductor region 109a and the whiskers 109b.

Note that the direction in which each of the whiskers 109b extends from the crystalline semiconductor region 109a is referred to as a long-side direction. A cross-sectional shape along the long-side direction is referred to as a long-side cross-sectional shape. In addition, the shape of a plane in which the long-side direction is a normal direction is referred to as a sliced cross-sectional shape.

As illustrated in FIG. 2B, the long-side direction of each of the whiskers 109b in the crystalline semiconductor region 109 is one direction, e.g., the normal direction to the surface of the conductive layer 104 or the surface of the mixed layer 105. Note that the long-side direction of each of the whiskers 109b may be substantially the same as the normal direction to the surface of the conductive layer 104 or the surface of the mixed layer 105, and it is preferable that the difference between the angles of the two directions be typically within 5°.

Note that in FIG. 2B, the long-side directions of the whiskers 109b in the crystalline semiconductor region 109 may follow one direction, e.g., the normal direction to the surface of the conductive layer 104 or to the surface of the mixed layer 105; or the long-side directions of the whiskers 109b may be random. Typically, the crystalline semiconductor region 109 may include a whisker whose long-side direction is substantially the same as the normal direction and a whisker whose long-side direction is different from the normal direction.

As described above, in the first step 201, the crystalline semiconductor region 109 which includes the plurality of whiskers 109b including a crystalline semiconductor is formed over the conductive layer 104 by an LPCVD method; in the second step 202, after the supply of the source gas containing a deposition gas including silicon is stopped, heat treatment is performed on the crystalline semiconductor region 109, whereby the number of the whiskers 109b per unit area and the density of the whiskers 109b in the crystalline semiconductor region 109 can be increased. Alternatively, the growth of the whiskers 109b is promoted, whereby the length in the axis of each of the whiskers 109b can be increased. Accordingly, a surface area of the crystalline semiconductor region 109 which includes the plurality of whiskers 109b including a crystalline semiconductor increases.

The crystalline semiconductor region 109 formed by the above-described process is used for an active material layer of the power storage device, and the conductive layer 104 which is formed by the above-described process or the mixed layer 105 which is formed by the above-described process is used as a current collector of the power storage device, whereby an electrode of the power storage device can be formed. Thus, the power storage device using the electrode can be formed.

The crystalline semiconductor region 109 formed by the above-described process is used for the active material layer of the power storage device, whereby the rate at which a reactant (carrier ions such as lithium ions) of the power storage device is adsorbed in the crystalline semiconductor or the rate at which the reactant is released from the crystalline semiconductor increases per unit mass. Since the rate at which the reactant is adsorbed or released is high, the amount of adsorption or release of the reactant at a high current density is increased; therefore, the discharge capacity or charge capacity of the power storage device can be increased.

Alternatively, the crystalline semiconductor region 109 which includes the plurality of whiskers 109b including a crystalline semiconductor is used for the active material layer of the power storage device, whereby it is possible to relieve stress that is generated when the reactant (carrier ions such as lithium ions) of the power storage device is adsorbed in the crystalline semiconductor and the crystalline semiconductor including the reactant expands.

Alternatively, the crystalline semiconductor region 109 which includes the crystalline semiconductor region 109a and the plurality of whiskers 109b including a crystalline semiconductor is used for the active material layer of the power storage device, whereby the crystalline semiconductor region 109a which is a flat portion does not need to be thick. Therefore, generation of stress due to large film thickness can be suppressed as compared to the case where only the crystalline semiconductor region 109a which is a flat portion is provided.

In addition, the crystalline semiconductor region 109 which includes the plurality of whiskers 109b including a crystalline semiconductor is formed by an LPCVD method, whereby throughput can be improved.

In the case where the crystalline semiconductor region 109 formed by the above-described process is used for the active material layer of the power storage device, the conductive layer 104 formed by the above-described process or the mixed layer 105 formed by the above-described process can be used as the current collector of the power storage device. In the case where the mixed layer 105 is formed, resistance at the interface between the mixed layer 105 and the crystalline semiconductor region 109 can be reduced, and adhesion can be increased; therefore, discharge capacity or charge capacity can be increased, and deterioration of the power storage device can be reduced.

Although an example in which the crystalline semiconductor region 109 is used for the active material layer of the power storage device is described; the crystalline semiconductor region 109 may be used for other applications. For example, the crystalline semiconductor region 109 may be used as a photoelectric conversion layer of a photoelectric conversion device. Alternatively, the crystalline semiconductor region 109 may be used as an anti-reflective film.

According to this embodiment, a power storage device whose a performance such as high discharge capacity or high charge capacity, or the like is improved, can be formed. In addition, a semiconductor region which can improve performance by using the power storage device or the like can be formed.

(Embodiment 2)

In this embodiment, a structure of a power storage device will be described with reference to FIGS. 3A and 3B.

First, a structure of a secondary battery is described below as a power storage device.

Among secondary batteries, a lithium ion battery formed using a metal oxide containing lithium, such as $LiCoO_2$, has high discharge capacity and high safety. Here, the structure of a lithium ion battery, which is a typical example of secondary battery, is described.

Figure 3A:
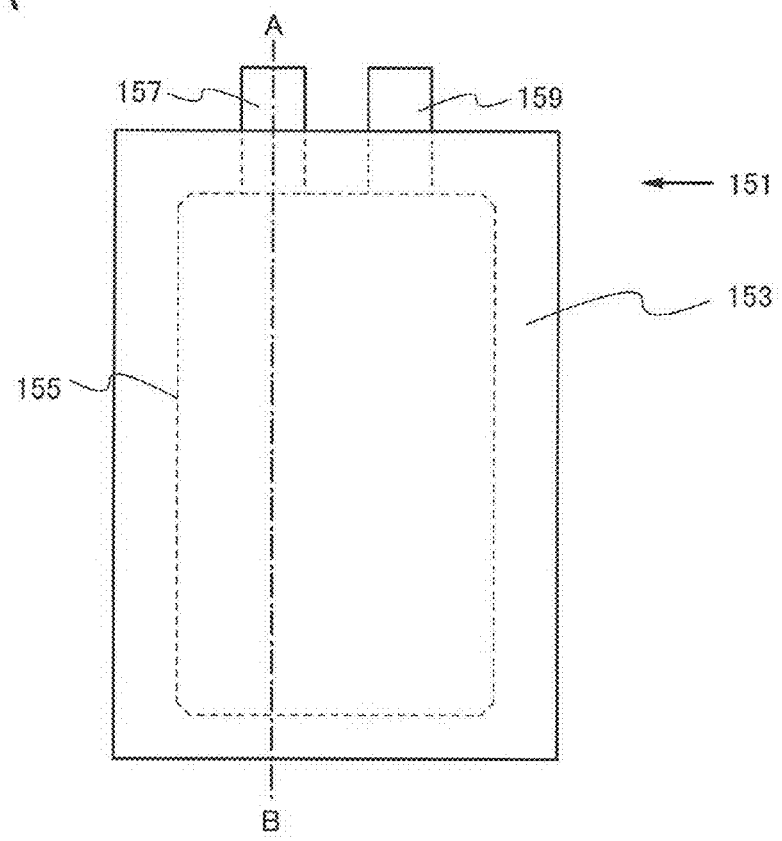
FIGS. 3A and 3B are respectively a plan view and a cross-sectional view of one embodiment of a power storage device.
Figure 3B:
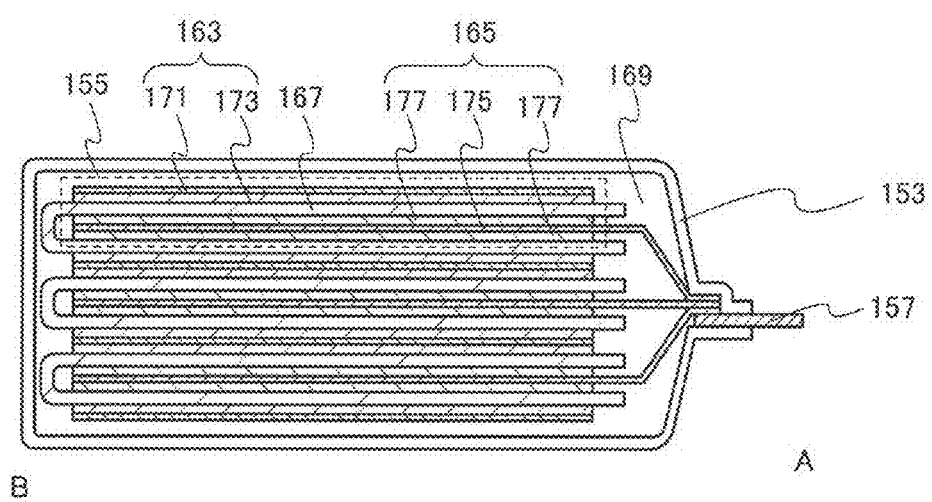

FIG. 3A is a plan view of a power storage device 151, and FIG. 3B is a cross-sectional view taken along dashed-dotted line A-B in FIG. 3A.

The power storage device 151 illustrated in FIG. 3A includes a power storage cell 155 in an exterior member 153. The power storage device 151 further includes a terminal portion 157 and a terminal portion 159 which are connected to the power storage cell 155. For the exterior member 153, a laminate film, a polymer film, a metal film, a metal case, a plastic case, or the like can be used.

As illustrated in FIG. 3B, the power storage cell 155 includes a negative electrode 163, a positive electrode 165, a separator 167 between the negative electrode 163 and the positive electrode 165, and an electrolyte 169 with which the separator 167 is filled.

The negative electrode 163 includes a negative electrode current collector 171 and a negative electrode active material layer 173.

The positive electrode 165 includes a positive electrode current collector 175 and a positive electrode active material layer 177. The negative electrode active material layer 173 is formed on one or both of the surfaces of the negative electrode current collector 171. The positive electrode active material layer 177 is formed on one or both of the surfaces of the positive electrode current collector 175.

The negative electrode current collector 171 is connected to the terminal portion 159. The positive electrode current collector 175 is connected to the terminal portion 157. Further, part of the terminal portion 157 and part of the terminal portion 159 are led out from the exterior member 153.

Note that although a sealed thin power storage device is described as the power storage device 151 in this embodiment, a power storage device can have a variety of structures; for example, a button storage device, a cylindrical storage device, or a rectangular storage device can be used. Further, although the structure where the positive electrode, the negative electrode, and the separator are stacked is described in this embodiment, a structure where the positive electrode, the negative electrode, and the separator are rolled may be employed.

The negative electrode current collector 171 can be formed using the conductive layer 104 or the mixed layer 105 described in Embodiment 1.

The negative electrode active material layer 173 can be formed using the active material layer, which is formed using the crystalline semiconductor region 109 described in Embodiment 1. Note that a crystalline silicon layer may be pre-doped with lithium. In addition, by forming the active material layer, which is formed using the crystalline semiconductor region 109, with the negative electrode current collector 171 held by a frame-like susceptor in an LPCVD apparatus, the active material layer can be formed on both surfaces of the negative electrode current collector 171 at the same time; therefore, the number of steps can be reduced.

Aluminum, stainless steel, or the like is used for the positive electrode current collector 175. The positive electrode current collector 175 can have a foil shape, a plate shape, a net shape, or the like, as appropriate.

The positive electrode active material layer 177 can be formed using $LiFeO_2$, $LiCoO_2$, $LiNiO_2$, $LiMn_2O_4$, $LiFePO_4$, $LiCoPO_4$, $LiNiPO_4$, $LiMn_2PO_4$, $V_2O_5$, $Cr_2O_5$, $MnO_2$, or other lithium compounds as a material. Note that when carrier ions are alkali metal ions other than lithium ions or alkaline earth metal ions, the positive electrode active material layer

177 can be formed using, instead of lithium in the above lithium compounds, an alkali metal (e.g., sodium or potassium), or an alkaline earth metal (e.g., calcium, strontium, or barium); alternatively, beryllium or magnesium can be used.

As a solute of the electrolyte 169, a material in which lithium ions, i.e., carrier ions, can transfer and stably exist is used. Typical examples of the solute of the electrolyte include lithium salt such as $LiClO_4$, $LiAsF_6$, $LiBF_4$, $LiPF_6$, and $Li(C_2F_5SO_2)_2N$. Note that when carrier ions are alkali metal ions other than lithium ions or alkaline earth metal ions, the solute of the electrolyte 169 can be formed using alkali metal salt such as sodium salt or potassium salt; alkaline earth metal salt such as calcium salt, strontium salt, or barium salt; alternatively, beryllium salt, magnesium salt, or the like can be used, as appropriate.

As the solvent of the electrolyte 169, a material which can transfer lithium ions is used. As the solvent of the electrolyte 169, an aprotic organic solvent is preferably used. Typical examples of aprotic organic solvents include ethylene carbonate, propylene carbonate, dimethyl carbonate, diethyl carbonate, γ-butyrolactone, acetonitrile, dimethoxyethane, tetrahydrofuran, and the like, and one or more of these materials can be used. When a gelled polymer is used as the solvent of the electrolyte 169, safety against liquid leakage or the like is increased. In addition, the power storage device 151 can be thin and lightweight. Typical examples of gelled polymers include a silicon gel, an acrylic gel, an acrylonitrile gel, polyethylene oxide, polypropylene oxide, a fluorine-based polymer, and the like.

As the electrolyte 169, a solid electrolyte such as $Li_3PO_4$ can be used.

An insulating porous material is used for the separator 167. Typical examples of the separator 167 include cellulose (paper), polyethylene, and polypropylene.

A lithium ion battery has a small memory effect, a high energy density, and high discharge capacity. In addition, the driving voltage of the lithium ion battery is high. Thus, the lithium ion battery can be formed to be compact and lightweight. Further, the lithium ion battery does not easily degrade due to repetitive charge and discharge and can be used for a long time, so that cost can be reduced.

Second, a structure of a capacitor which is another example of a power storage device will be described. Typical examples of capacitors include a double-layer capacitor, a lithium ion capacitor, and the like.

In the case of a capacitor, instead of the positive electrode active material layer 177 in the secondary battery in FIG. 3B, a material capable of reversibly adsorbing lithium ions and/or anions is preferably used. Typical examples of the positive electrode active material layer 177 include active carbon, a conductive polymer, and a polyacene organic semiconductor (PAS).

The lithium ion capacitor has high efficiency of charge and discharge, capability of rapidly performing charge and discharge, and a long life even when it is repeatedly used.

When the current collector (the conductive layer 104 or the mixed layer 105) and the active material layer (the crystalline semiconductor region 109) which are described in Embodiment 1 are used for the negative electrode 163, a power storage device with high discharge capacity or high charge capacity can be manufactured.

In addition, by using the current collector and the active material layer which are described in Embodiment 1 in a negative electrode of an air cell which is one embodiment of the power storage device, a power storage device with high discharge capacity or high charge capacity can be manufactured.

(Embodiment 3)

In this embodiment, an application example of the power storage device described in Embodiment 2 will be described with reference to FIGS. 4A to 4D.

The power storage device described in Embodiment 2 can be used in electronic devices, e.g., cameras such as digital cameras or video cameras, digital photo frames, mobile phones (also referred to as cellular phones or cellular phone devices), portable game machines, portable information terminals, or audio reproducing devices. Further, the power storage device can be used in electric propulsion vehicles such as electric vehicles, hybrid vehicles, train vehicles, maintenance vehicles, carts, or electric wheelchairs. Here, examples of electric propulsion vehicles are described.

Figure 4A:
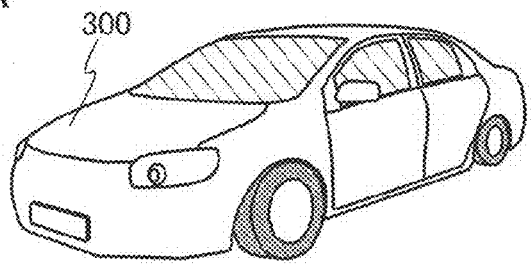
FIGS. 4A to 4D are views each illustrating an application example of a power storage device.
Figure 4B:
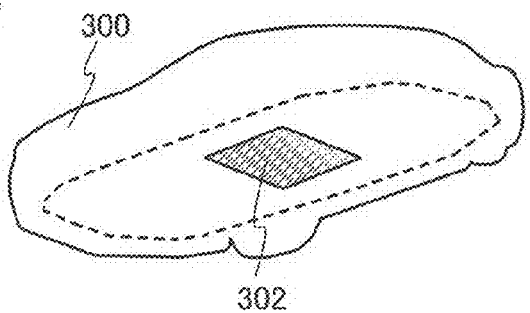

FIG. 4A illustrates a structure of a four-wheeled vehicle 300 which is one of the electric propulsion vehicles. The vehicle 300 is an electric vehicle or a hybrid vehicle. An example is illustrated in which the vehicle 300 includes a power storage device 302 provided on its bottom portion. In order to clearly show the position of the power storage device 302 in the vehicle 300, FIG. 4B shows the outline of the vehicle 300 and the power storage device 302 provided on the bottom portion of the vehicle 300. The power storage device described in Embodiment 2 can be used as the power storage device 302. Charge of the power storage device 302 can be performed by external electric power supply using a plug-in technique or a wireless power feeding system.

Figure 4C:
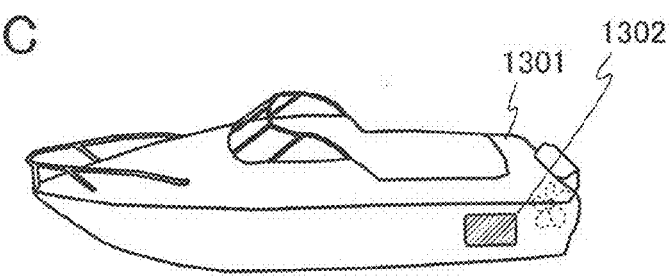

FIG. 4C illustrates a structure of a motor boat 1301 which is one of the electric propulsion vehicles. FIG. 4C illustrates the case where the motor boat 1301 includes a power storage device 1302 equipped on a side of the body of the boat. The power storage device described in Embodiment 2 can be used as the power storage device 1302. Charge of the power storage device 1302 can be performed by external electric power supply using a plug-in technique or a wireless power feeding system. For example, a power feeding device for charging the motor boat 1301 (that is, charge of the power storage device 1302) may be equipped at a mooring in a harbor.

Figure 4D:
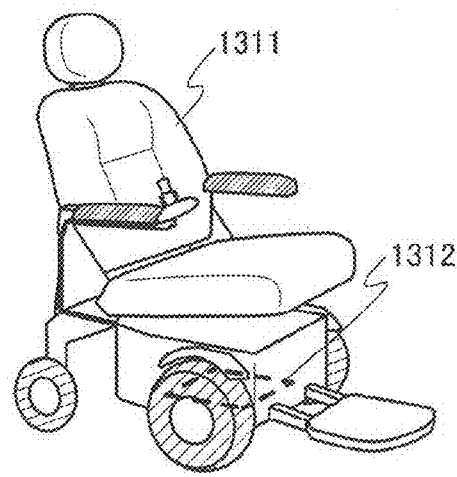

FIG. 4D illustrates a structure of an electric wheelchair 1311 which is one of the electric propulsion vehicles. FIG. 4D illustrates the case where the electric wheelchair 1311 includes a power storage device 1312 provided on its bottom portion. The power storage device described in Embodiment 2 can be used as the power storage device 1312. Charge of the power storage device 1312 can be performed by external electric power supply using a plug-in technique or a wireless power feeding system.

(Embodiment 4)

In this embodiment, an example in which a secondary battery that is an example of the power storage device according to one embodiment of the present invention is used in a wireless power feeding system (hereinafter referred to as an RF power feeding system) will be described with reference to block diagrams in FIG. 5 and FIG. 6. In each of the block diagrams, independent blocks show elements within a power receiving device and a power feeding device, which are classified according to their functions. However, it may be practically difficult to completely separate the elements according to their functions; in some cases, one element can involve a plurality of functions.

First, the RF power feeding system is described with reference to FIG. 5.

A power receiving device 600 is an electronic device or an electric propulsion vehicle which is driven by electric power supplied from a power feeding device 700, and can be applied to another device which is driven by electric power, as appropriate. Typical examples of the electronic device include cameras such as digital cameras or video cameras, digital photo frames, mobile phones (also referred to as cellular phones or cellular phone devices), portable game machines, portable information terminals, audio reproducing devices, display devices, computers, and the like. Typical examples of the electric propulsion vehicles include electric vehicles, hybrid vehicles, train vehicles, maintenance vehicles, carts, electric wheelchairs, and the like. In addition, the power feeding device 700 has a function of supplying electric power to the power receiving device 600.

Figure 5:
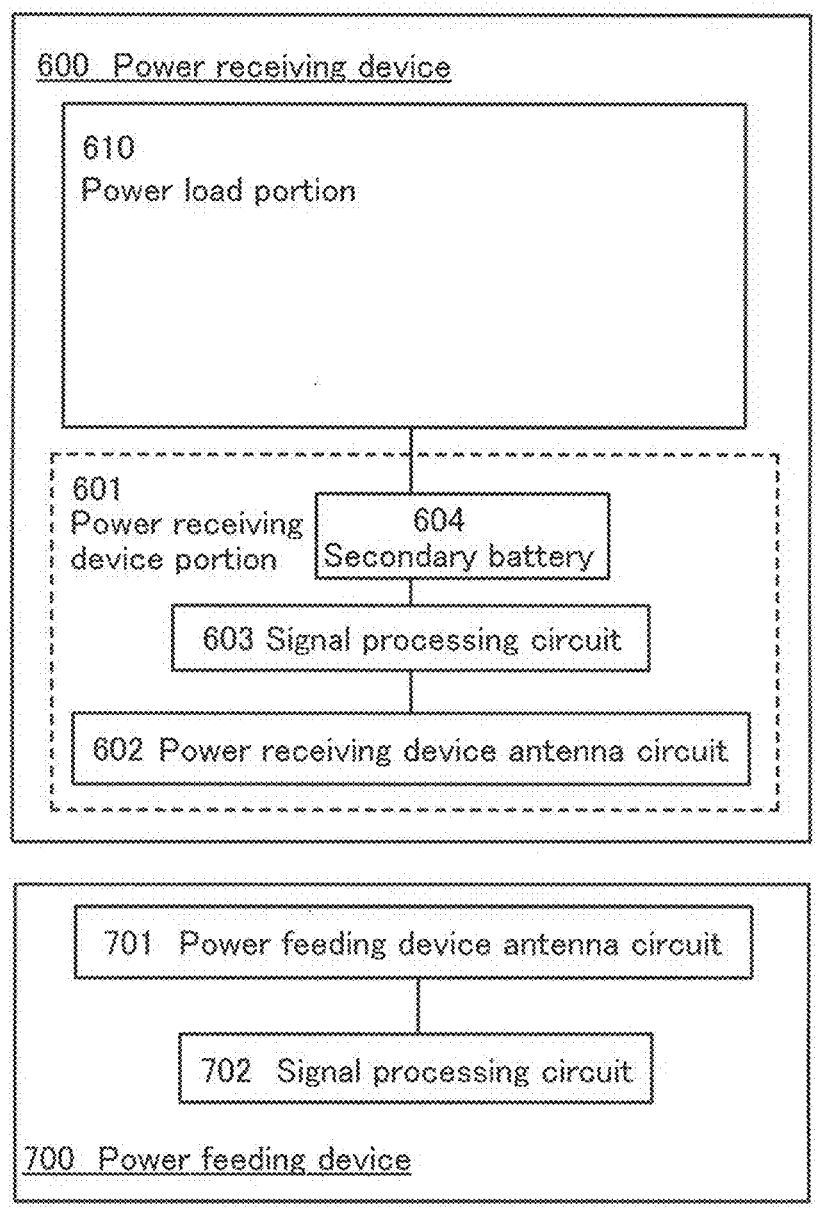
FIG. 5 illustrates a configuration of a wireless power feeding system.

In FIG. 5, the power receiving device 600 includes a power receiving device portion 601 and a power load portion 610. The power receiving device portion 601 includes at least a power receiving device antenna circuit 602, a signal processing circuit 603, and a secondary battery 604. The power feeding device 700 includes at least a power feeding device antenna circuit 701 and a signal processing circuit 702.

The power receiving device antenna circuit 602 has a function of receiving a signal transmitted by the power feeding device antenna circuit 701 or transmitting a signal to the power feeding device antenna circuit 701. The signal processing circuit 603 processes a signal received by the power receiving device antenna circuit 602 and controls charging of the secondary battery 604 and supplying of electric power from the secondary battery 604 to the power load portion 610. In addition, the signal processing circuit 603 controls operation of the power receiving device antenna circuit 602. That is, the signal processing circuit 603 can control the intensity, the frequency, or the like of a signal transmitted by the power receiving device antenna circuit 602. The power load portion 610 is a driving portion which receives electric power from the secondary battery 604 and drives the power receiving device 600. Typical examples of the power load portion 610 include a motor, a driver circuit, and the like. Another device which drives the power receiving device by receiving electric power can be used as the power load portion 610, as appropriate. The power feeding device antenna circuit 701 has a function of transmitting a signal to the power receiving device antenna circuit 602 or receiving a signal from the power receiving device antenna circuit 602. The signal processing circuit 702 processes a signal received by the power feeding device antenna circuit 701. In addition, the signal processing circuit 702 controls operation of the power feeding device antenna circuit 701. That is, the signal processing circuit 702 can control the intensity, the frequency, or the like of a signal transmitted by the power feeding device antenna circuit 701.

A secondary battery according to one embodiment of the present invention is used as the secondary battery 604 included in the power receiving device 600 in the RF power feeding system illustrated in FIG. 5.

With the use of the secondary battery according to one embodiment of the present invention in the RF power feeding system, discharge capacity or charge capacity (also referred to as the amount of power storage) can be larger than that in a conventional secondary battery. Therefore, the time interval of the wireless power feeding can be longer (frequent power feeding can be omitted).

In addition, with the use of the secondary battery according to one embodiment of the present invention in the RF power feeding system, the power receiving device 600 can be formed to be compact and lightweight if the discharge capacity or charge capacity with which the power load portion 610 can be driven is the same as that in a conventional power storage device. Therefore, the total cost can be reduced.

Next, another example of the RF power feeding system is described with reference to FIG. 6.

Figure 6:
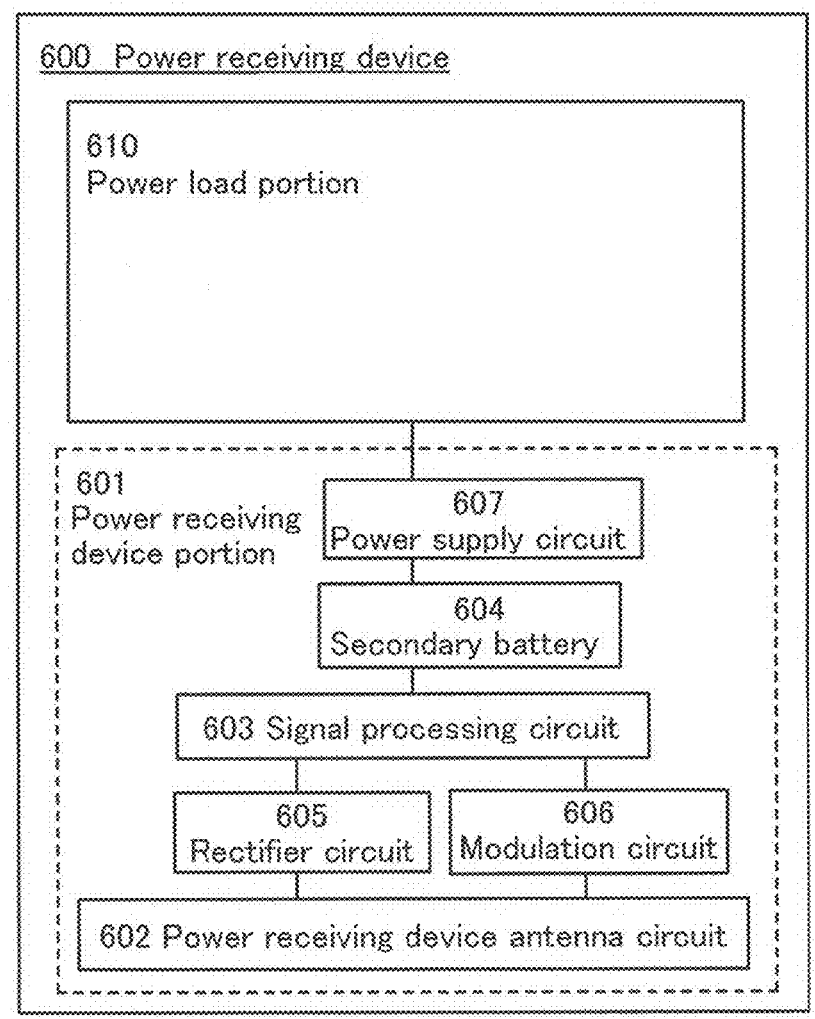
FIG. 6 illustrates a configuration of a wireless power feeding system.
Figure 6:
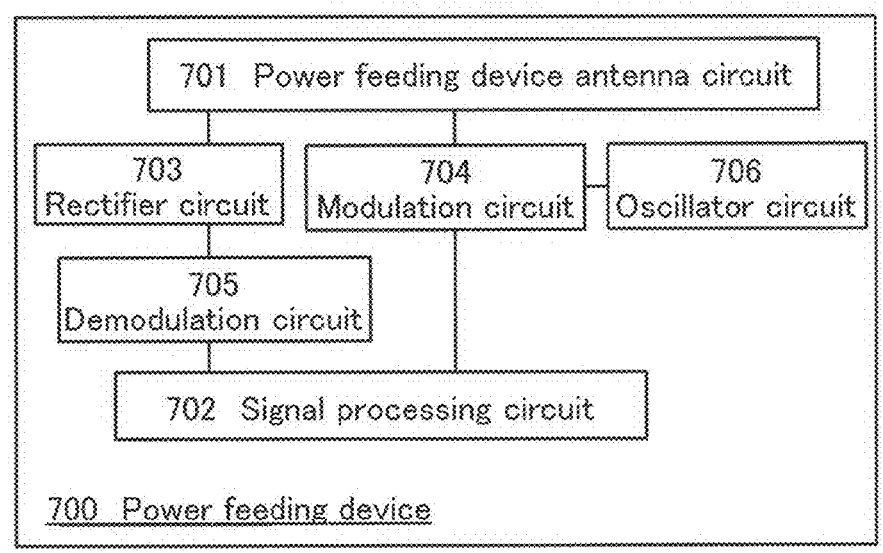

In FIG. 6, the power receiving device 600 includes the power receiving device portion 601 and the power load portion 610. The power receiving device portion 601 includes at least the power receiving device antenna circuit 602, the signal processing circuit 603, the secondary battery 604, a rectifier circuit 605, a modulation circuit 606, and a power supply circuit 607. In addition, the power feeding device 700 includes at least the power feeding device antenna circuit 701, the signal processing circuit 702, a rectifier circuit 703, a modulation circuit 704, a demodulation circuit 705, and an oscillator circuit 706.

The power receiving device antenna circuit 602 has a function of receiving a signal transmitted by the power feeding device antenna circuit 701 or transmitting a signal to the power feeding device antenna circuit 701. When the power receiving device antenna circuit 602 receives a signal transmitted by the power feeding device antenna circuit 701, the rectifier circuit 605 has a function of generating DC voltage from the signal received by the power receiving device antenna circuit 602. The signal processing circuit 603 has a function of processing a signal received by the power receiving device antenna circuit 602 and controlling charging of the secondary battery 604 and supplying of electric power from the secondary battery 604 to the power supply circuit 607. The power supply circuit 607 has a function of converting voltage stored in the secondary battery 604 into voltage needed for the power load portion 610. The modulation circuit 606 is used when a certain response signal is transmitted from the power receiving device 600 to the power feeding device 700.

With the power supply circuit 607, electric power supplied to the power load portion 610 can be controlled. Thus, overvoltage application to the power load portion 610 can be suppressed, and deterioration or breakdown of the power receiving device 600 can be reduced.

In addition, with the modulation circuit 606, a signal can be transmitted from the power receiving device 600 to the power feeding device 700. Therefore, when the amount of charged power in the power receiving device 600 is judged and a certain amount of power is charged, a signal is transmitted from the power receiving device 600 to the power feeding device 700 so that power feeding from the power feeding device 700 to the power receiving device 600 can be stopped. As a result, the secondary battery 604 is not fully charged, so that deterioration or breakdown of the power receiving device 600 can be reduced, whereby the number of charge times of the secondary battery 604 can be increased.

The power feeding device antenna circuit 701 has a function of transmitting a signal to the power receiving device antenna circuit 602 or receiving a signal from the power receiving device antenna circuit 602. When a signal is transmitted to the power receiving device antenna circuit 602, the signal processing circuit 702 generates a signal which is transmitted to the power receiving device 600. The oscillator circuit 706 generates a signal with a constant frequency. The modulation circuit 704 has a function of applying voltage to the power feeding device antenna circuit 701 in accordance with the signal generated by the signal processing circuit 702 and the signal with a constant frequency generated by the oscillator circuit 706. Thus, a signal is output from the power feeding device antenna circuit 701. On the other hand, when a signal is received from the power receiving device antenna circuit 602, the rectifier circuit 703 has a function of rectifying the received signal. From signals rectified by the rectifier circuit 703, the demodulation circuit 705 extracts a signal transmitted from the power receiving device 600 to the power feeding device 700. The signal processing circuit 702 has a function of analyzing the signal extracted by the demodulation circuit 705.

Note that any circuit may be provided between circuits as long as the RF power feeding can be performed. For example, after the power receiving device 600 receives a signal and the rectifier circuit 605 generates DC voltage, a circuit such as a DC-DC converter or regulator that is provided in a subsequent stage may generate constant voltage. Thus, application of overvoltage to the inside of the power receiving device 600 can be suppressed.

The secondary battery according to one embodiment of the present invention is used as the secondary battery 604 included in the power receiving device 600 in the RF power feeding system illustrated in FIG. 6.

With the use of the secondary battery according to one embodiment of the present invention in the RF power feeding system, the discharge capacity or charge capacity can be larger than that in a conventional secondary battery. Therefore, the time interval of the wireless power feeding can be longer (frequent power feeding can be omitted).

In addition, with the use of the secondary battery according to one embodiment of the present invention in the RF power feeding system, the power receiving device 600 can be formed to be compact and lightweight if the discharge capacity or charge capacity with which the power load portion 610 can be driven is the same as that in a conventional secondary battery. Therefore, the total cost can be reduced.

Note that when the secondary battery according to one embodiment of the present invention is used in the RF power feeding system and the power receiving device antenna circuit 602 and the secondary battery 604 are overlapped with each other, it is preferable that the impedance of the power receiving device antenna circuit 602 is not changed by deformation of the secondary battery 604 due to charge and discharge of the secondary battery 604 and deformation of an antenna due to the above deformation. When the impedance of the antenna is changed, in some cases, electric power is not supplied sufficiently. For example, the secondary battery 604 may be placed in a battery pack formed using metal or ceramics. Note that in that case, the power receiving device antenna circuit 602 and the battery pack are preferably separated from each other by several tens of micrometers or more.

In this embodiment, the charging signal has no limitation on its frequency and may have any band of frequency as long as electric power can be transmitted. For example, the charging signal may have any of an LF band of 135 kHz (low frequency), an HF band of 13.56 MHz (high frequency), a UHF band of 900 MHz to 1 GHz (ultra high frequency), and a microwave band of 2.45 GHz.

A signal transmission method may be selected from various methods including an electromagnetic coupling method, an electromagnetic induction method, a resonance method, and a microwave method, as appropriate. In order to prevent energy loss due to foreign substances containing moisture, such as rain and mud, the electromagnetic induction method or the resonance method using a low frequency band, specifically, very-low frequencies of 3 kHz to 30 kHz, low frequencies of 30 kHz to 300 kHz, medium frequencies of 300 kHz to 3 MHz, or high frequencies of 3 MHz to 30 MHz is preferably used.

This embodiment can be implemented in combination with any of the above embodiments.

EXAMPLE 1

In this example, a method for forming a semiconductor region which is one embodiment of the present invention will be described. In this example, a semiconductor region using a method for forming a semiconductor region which is one embodiment of the present invention, and a semiconductor region using another forming method were formed, and the semiconductor regions were observed.

First, a method for forming a semiconductor region which is one embodiment of the present invention is described. A titanium film with a thickness of 500 nm was formed over a glass substrate by a sputtering method. Next, the titanium film was selectively etched through a photolithography process, and the titanium film was patterned. Hydrofluoric acid was used as an etchant.

Next, the glass substrate having the titanium film was put in a reaction space (reaction chamber) of an LPCVD apparatus.

<First Step>

The reaction space was heated, and temperature of the glass substrate was kept at 600° C. Silane was used as a source gas and supplied to the reaction space (also referred to as "to be introduced") so that pressure in the reaction space was 20 Pa, and a crystalline silicon region was formed over the titanium film by an LPCVD method. The flow rate of silane was 300 sccm. The time of formation of the crystalline silicon region was 2 hours 15 minutes.

<Second Step>

Next, supply of silane which was a source gas was stopped. Heat treatment was performed so that the temperature of the glass substrate was kept at 600° C. even after the supply of silane which was a source gas was stopped. The time of the heat treatment was 2 hours. The heat treatment was performed while the reaction space was evacuated with a dry pump and a mechanical booster pump. When the reaction space was evacuated with the dry pump and the mechanical booster pump, the pressure in the reaction space was kept at approximately lower than or equal to 0.1 Pa.

Then, the temperature of the reaction space is decreased, and the glass substrate was taken out.

Figure 7:
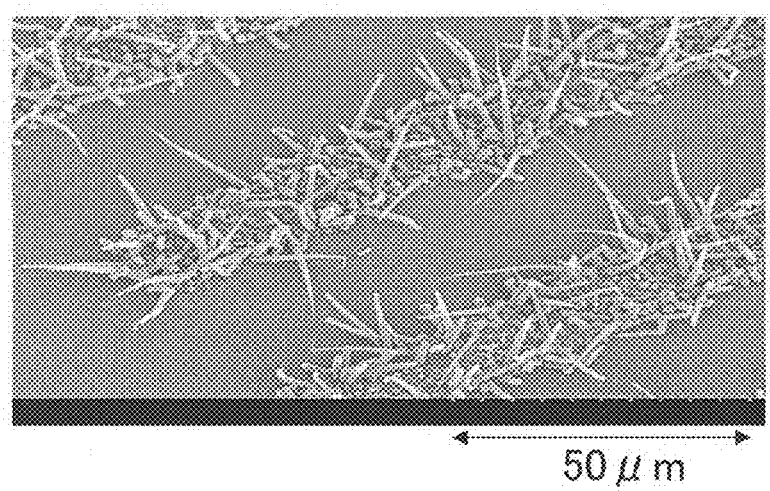
FIG. 7 is a photograph of a semiconductor region.

FIG. 7 is a photograph of the crystalline silicon region formed through the above-described process. As shown in FIG. 7, a plurality of whiskers (whisker group) was observed in the crystalline silicon region which was formed through the first step and the second step. The number of whiskers per unit area was relatively large and the density of whiskers was relatively high. In addition, many whiskers which were relatively thin and long were observed. Further, many whiskers with sharp ends were observed. From FIG. 7, the number of whiskers in the crystalline silicon region formed through the above-described process was approximately 10 to 15 or around 10 to 15 per 100 μm$^2$. Note that the whiskers were observed only in a region where the titanium film was formed.

COMPARATIVE EXAMPLE

Next, a semiconductor region is formed by another formation method. Steps up and including the first step were performed in a manner similar to the formation method of the crystalline silicon region; then, the temperature of the reaction space was decreased and the glass substrate was taken out.

Figure 8:
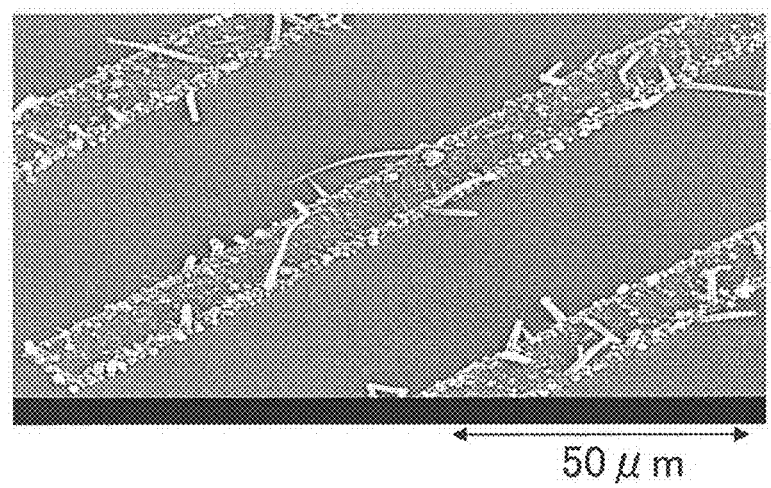
FIG. 8 is a photograph of a semiconductor region (comparative example).

FIG. 8 is a photograph of the crystalline silicon region formed through the above-described process. As shown in FIG. 8, although the crystalline silicon region formed only through the first step without the second step had whiskers, the number of whiskers per unit area was small and the density of whiskers was low, as compared to the crystalline silicon region shown in FIG. 7. From FIG. 8, the number of whiskers in the crystalline silicon region formed through the above-described process was approximately 1 or 2 or around 1 or 2 per 100 µm².

<Whisker Growth Mechanism>

The difference between the crystalline silicon region shown in FIG. 7 and the crystalline silicon region (comparative example) shown in FIG. 8 is that whether the heat treatment in the second step is performed or not. As shown in FIG. 7, it is observed that the crystalline silicon region on which the heat treatment was performed has a relatively large number of whiskers per unit area, a relatively high density of whiskers, and many whiskers which are relatively long. From the results, it is supposed that whiskers grow by heat treatment. In that case, it is thought that silicon is supplied not by silane which is a source gas but by the crystalline silicon region that is the crystalline semiconductor region 109a formed below the lower side of the whiskers. A possible mechanism of whisker growth by heat treatment has been considered and will be described with reference to FIGS. 9A to 9C.

Figure 9A:
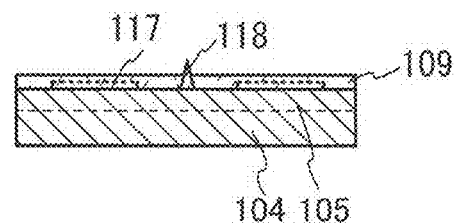
FIGS. 9A to 9C illustrate a whisker growth mechanism.
Figure 9B:
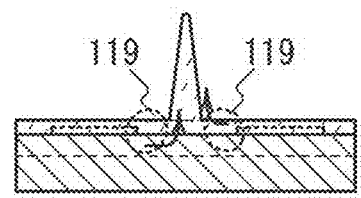
Figure 9C:
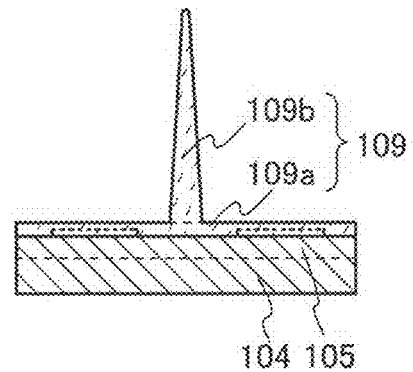

FIGS. 9A to 9C show a conjectured whisker growth mechanism. The case where a thin titanium oxide layer 117 is formed over a conductive layer 104 made of a titanium film is assumed below. In a process in which a crystalline silicon region that is the crystalline semiconductor region 109 is formed over the conductive layer 104 made of a titanium film by an LPCVD method, a mixed layer 105 of titanium and silicon $TiSi_x$ ($0<x\leq2$) is formed between the conductive layer 104 made of the titanium film and the titanium oxide layer 117 as illustrated in FIG. 9A. Then, a crystalline nucleus 118 is generated in the crystalline silicon region that is the crystalline semiconductor region 109 or the mixed layer 105 due to the factor of uneven stress of the crystalline silicon region that is the crystalline semiconductor region 109 or of the mixed layer 105 or the like. It is thought that, as one of the factors of generation of the crystalline nucleus 118, the uneven stress of the crystalline silicon region that is the crystalline semiconductor region 109 or of the mixed layer 105 is caused by the uneven (that is, partial) titanium oxide layer 117 over the mixed layer 105. Note that the example in which the titanium oxide layer 117 is formed above the titanium film that is the conductive layer 104 is illustrated in FIGS. 9A to 9C; the titanium oxide layer 117 is not necessarily formed.

Further, it is thought that a supersaturation region 119 where silicon becomes supersaturated is generated in the vicinity of the crystalline nucleus 118 by heat treatment, silicon is supplied from the supersaturation region 119, and a whisker grows from a lower part to an upper part starting from the crystalline nucleus 118, as illustrated in FIG. 9B. In addition, it is thought that silicon is supplied from the supersaturation region 119 to a side surface of the whisker and the width of the whisker changes. In this manner, it is thought that the crystalline silicon region that is the crystalline semiconductor region 109 which includes the crystalline silicon region that is the crystalline semiconductor region 109a and the whiskers 109b including crystalline silicon is formed as shown in FIG. 9C.

This application is based on Japanese Patent Application serial no. 2010-150098 filed with the Japan Patent Office on Jun. 30, 2010, the entire contents of which are hereby incorporated by reference.

What is claimed is:

1. A method for forming a semiconductor region, the method comprising the steps of:
    disposing in a reaction chamber a substrate having a conductive layer;
    forming a first semiconductor region over the conductive layer by low pressure chemical vapor-phase deposition method while supplying a source gas containing silicon; and
    forming silicon whiskers from the first semiconductor region by performing heat treatment on the first semiconductor region after stopping the source gas.

2. A method for forming a semiconductor region according to claim 1,
    wherein the conductive layer is formed with a metal forming silicide by reaction with silicon.

3. A method for forming a semiconductor region according to claim 1,
    wherein the conductive layer comprises one of zirconium, titanium. hafnium, vanadium, niobium, tantalum, chromium, molybdenum, tungsten, cobalt, and nickel.

4. A method for forming a semiconductor region according to claim 1,
    wherein a mixed layer is formed by diffusion of silicon into at least part of the conductive layer.

5. A method for forming a semiconductor region according to claim 1,
    wherein the low pressure chemical vapor-phase deposition method is performed at a temperature higher than 550° C.

6. A method for forming a semiconductor region according to claim 1,
    wherein the heat treatment is performed at a temperature higher than 550° C.

7. A method for forming a semiconductor region according to claim 1,
    wherein one of silicon hydride, silicon fluoride, and silicon chloride is used for the source gas including silicon in the low pressure chemical vapor-phase deposition method.

8. A method for forming a semiconductor region according to claim 1,
    wherein a second semiconductor region is formed from the first semiconductor region during the heat treatment, and
    wherein at least one of an anti-reflective film and a photoelectric conversion layer includes the conductive layer, the second semiconductor region and the silicon whiskers.

9. A method for manufacturing a power storage device, the method comprising the steps of:
    disposing in a reaction chamber a substrate having a conductive layer;
    forming a semiconductor region over the conductive layer by low pressure chemical vapor-phase deposition method while supplying a source gas containing silicon;
    forming a second semiconductor region and silicon whiskers from the semiconductor region by performing heat treatment on the semiconductor region after stopping the source gas; and
    forming an electrode including the conductive layer, the second semiconductor region and the silicon whiskers.

10. A method for manufacturing a power storage device according to claim 9,
    wherein the conductive layer is formed with a metal forming silicide by reaction with silicon.

11. A method for manufacturing a power storage device according to claim 9,
    wherein the conductive layer comprises one of zirconium, titanium, hafnium, vanadium, niobium, tantalum, chromium, molybdenum, tungsten, cobalt, and nickel.

12. A method for manufacturing a power storage device according to claim 9, wherein a mixed layer is formed by diffusion of silicon into at least part of the conductive layer.

13. A method for manufacturing a power storage device according to claim 9,
wherein the low pressure chemical vapor-phase deposition method is performed at a temperature higher than 550° C.

14. A method for manufacturing a power storage device according to claim 9,
wherein the heat treatment is performed at a temperature higher than 550° C.

15. A method for manufacturing a power storage device according to claim 9,
wherein one of silicon hydride, silicon fluoride, and silicon chloride is used for the source gas including silicon in the low pressure chemical vapor-phase deposition method.

16. A method for manufacturing a power storage device according to claim 9,
wherein an active material layer of the electrode comprises the second semiconductor region and the silicon whiskers; and
wherein a current collector of the electrode comprises the conductive layer.

* * * * *

UNITED STATES PATENT AND TRADEMARK OFFICE
CERTIFICATE OF CORRECTION

PATENT NO.         : 8,846,530 B2
APPLICATION NO.    : 13/158629
DATED              : September 30, 2014
INVENTOR(S)        : Makoto Furuno et al.

It is certified that error appears in the above-identified patent and that said Letters Patent is hereby corrected as shown below:

In the Specification:

Col. 5, line 65, "equal to 2.5 µM" should read --equal to 2.5 µm--

In the Claims:

Col. 16, line 15, Claim 3, "titanium." should read --titanium,--

Signed and Sealed this
Fifth Day of May, 2015

Michelle K. Lee
*Director of the United States Patent and Trademark Office*